United States Patent
Karl et al.

(10) Patent No.: US 6,259,610 B1
(45) Date of Patent: Jul. 10, 2001

(54) CIRCUIT SYSTEM FOR CONNECTING AN ELECTRICAL CONSUMER WITH AN ALTERNATING-VOLTAGE SOURCE

(75) Inventors: Matthias Karl, Ettlingen; Martin Frei, Vahingen/Enz, both of (DE)

(73) Assignee: Robert Bosch GmbH, Stuttgart (DE)

( * ) Notice: Subject to any disclaimer, the term of this patent is extended or adjusted under 35 U.S.C. 154(b) by 0 days.

(21) Appl. No.: 09/380,717

(22) PCT Filed: Sep. 18, 1998

(86) PCT No.: PCT/DE98/02770

§ 371 Date: Nov. 8, 1999

§ 102(e) Date: Nov. 8, 1999

(87) PCT Pub. No.: WO99/35744

PCT Pub. Date: Jul. 15, 1999

(30) Foreign Application Priority Data

Jan. 5, 1998 (DE) .............................. 198 00 147

(51) Int. Cl.[7] .............................. H02M 3/335; H02M 5/45
(52) U.S. Cl. .................................. 363/21.09; 363/21.07; 363/37
(58) Field of Search ................................ 363/21.09, 21, 363/97, 98, 131, 132, 127, 37; 323/222, 284, 285, 289

(56) References Cited

U.S. PATENT DOCUMENTS 3,887,838 * 6/1975 Thurston .............................. 315/376
4,222,086 * 9/1980 Runyon .............................. 361/93.6
4,443,712   4/1984 Gokita .
5,600,546 * 2/1997 Ho et al. .............................. 363/21
5,831,349 * 11/1998 Weng .............................. 307/125

FOREIGN PATENT DOCUMENTS 2 099 243   12/1982 (GB) .
96/07239    3/1996 (WO) .

* cited by examiner

*Primary Examiner*—Rajnikant B. Patel
(74) *Attorney, Agent, or Firm*—Michael J. Striker

(57) ABSTRACT

The circuit arrangement for connecting a consumer to an alternating voltage source includes a switch actuator (16) connectable in series with the consumer (12) and an electronic circuit (22) associated with the switch actuator and supplied with a direct voltage by means of it. The switch actuator (16) includes a rectifier for supplying the direct voltage to the electronic circuit, a transformer (24) comprising a secondary winding (32) supplying power to the rectifier, a first low inductance primary winding (26) and a second high inductance primary winding (28) and a switching device (36,42) controlled by the electronic circuit (22) to switch between the primary windings. Another switching device (44) is connected in parallel with the first primary winding (26) in order to short-circuit it for a predetermined short-circuit duration as a function of a nominal power consumed by the consumer. The switching device (36,42) can be a relay or a semiconductor component.

6 Claims, 1 Drawing Sheet

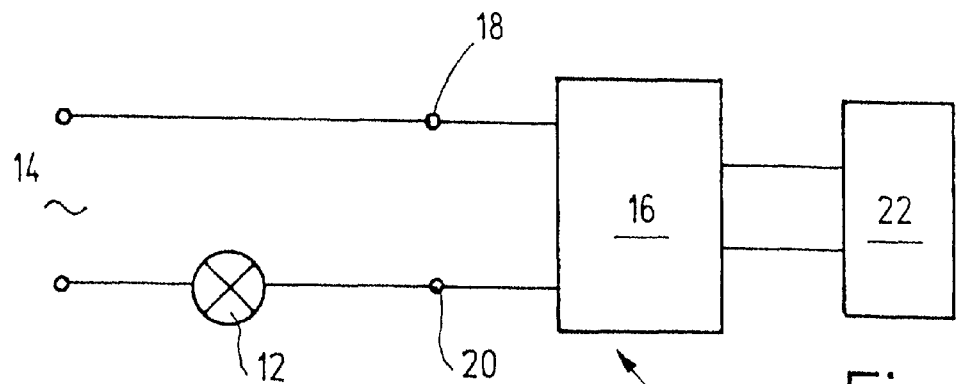
Fig. 1
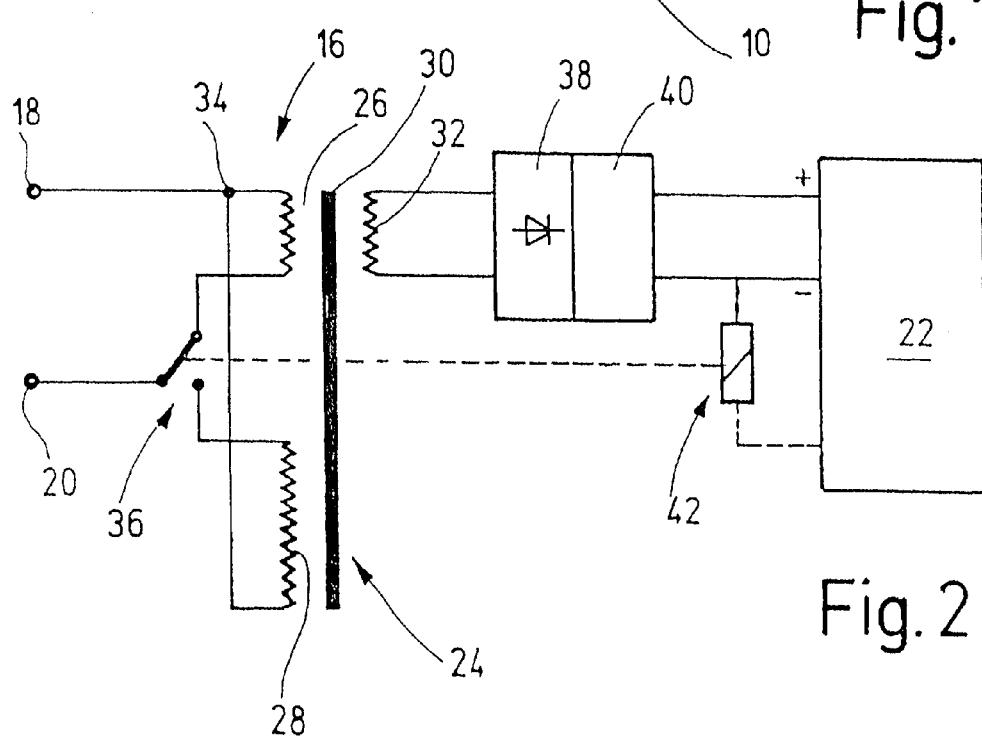
Fig. 2
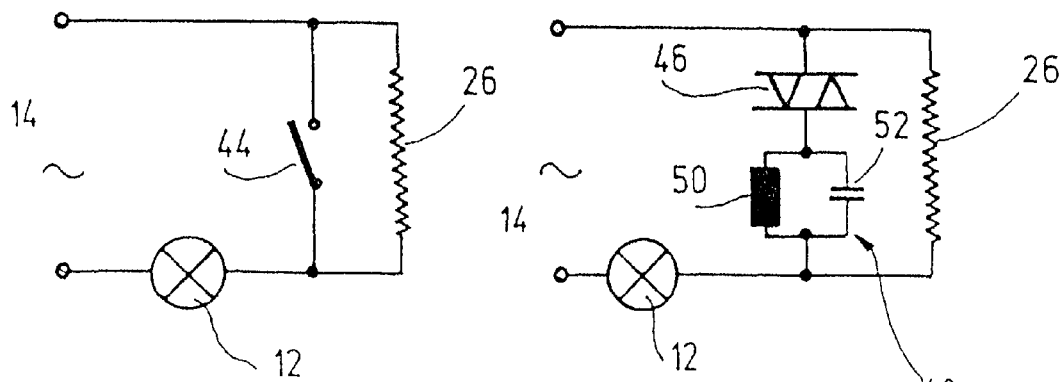
Fig. 3
Fig. 4

CIRCUIT SYSTEM FOR CONNECTING AN ELECTRICAL CONSUMER WITH AN ALTERNATING-VOLTAGE SOURCE

BACKGROUND OF THE INVENTION

1. Field of the Invention

The invention relates to a circuit arrangement for connecting an electrical consumer to an alternating voltage source, wherein the electrical consumer is connected in series with a switch actuator and the switch actuator is associated with an electronic circuit whose direct voltage supply is carried out by the switch actuator.

2. Prior Art

Circuit arrangements of this generic type are known. These are used in residential wiring, for example, where electrical consumers are intended to be variably controllable by way of a bus and the wiring is carried out in a so-called two-wire technique (phase is connected through, no neutral conductor). A typical application example is the switching on and off of a light. Triacs or thyristors are used in a known manner as switch actuators which, in the alternating voltage circuit, can be brought into a high-impedance (off) state or a low-impedance (on) state as possible switching states. These are triggered by way of an electronic circuit which receives its direct voltage supply from the triac or the thyristor. If the triac or the thyristor is in the high-impedance state, a circuit for generating constant voltage, as a direct voltage source for the electronic circuit, is supplied with power via a capacitive or inductive series resistor. Usually Zener diodes or reference diodes are used as constant voltage generators in this connection.

In order to trigger the electrical consumers, the triac or the thyristor, when in the low-impedance state, are operated in phase-angle control, i.e. with each half-wave of the alternating voltage, the thyristor or the triac is connected through when the corresponding voltage required for this triggering has built up in the constant voltage generator.

In the known circuit arrangement, it is disadvantageous that in the high-impedance state of the switch actuator, only a relatively low current is available to the electronic circuit and this current is limited by the internal resistance of the electrical consumer. The higher the internal resistance of the electrical consumer, the lower the available power. It is also disadvantageous that in the low-impedance state of the switch actuator, the phase-angle control withholds a significant portion of the available voltage and therefore power from the electrical consumer. As a result of this, the electrical consumer cannot achieve its nominal power, particularly when it has a relatively low nominal power.

SUMMARY OF THE INVENTION

It is an object of the present invention to provide an improved circuit arrangement for connecting an electrical consumer to an alternating voltage source, which does not suffer from the above-described disadvantages.

According to the invention the circuit arrangement for connecting an electrical consumer to an alternating voltage source comprises a switch actuator connectable in series with the electrical consumer and an electronic circuit associated with the switch actuator and supplied with a direct voltage by means of it. The switch actuator includes a rectifier for supplying the direct voltage to the electronic circuit, a transformer comprising a secondary winding supplying power to the rectifier, a low inductance first primary winding and a high inductance second primary winding as well as switching means actuatable by the electronic circuit to switch between the two primary windings. Another switching means (44) is connected in parallel with the first primary winding (26) in order to short-circuit it for a predetermined short-circuit duration as a function of a nominal power consumed by the consumer.

The circuit arrangement according to the invention offers the advantage that the supply of direct voltage for the electronic circuit associated with the switch actuator is improved, particularly in the high-impedance state of the switch actuator, and that at the same time, the switch actuator and devices connected to it can be operated in a stable manner using the two-wire technique. Since the switch actuator includes a transformer which has two switchable primary windings that can be connected in series with the electrical consumer, wherein a first primary winding has a low inductance and a second primary winding has a high inductance and the secondary winding has a rectifier for producing the direct voltage supply, it is advantageously possible on the one hand to supply the direct voltage as a protection low voltage since the transformer produces a galvanic decoupling from the primary and therefore load circuit and on the other hand by switching between the two primary windings, to determine the high-impedance or low-impedance state of the switch actuator. In the high-impedance state, which corresponds to the off state of the electrical consumer, a relatively high internal resistance can be achieved in accordance with the inductance of the primary winding associated with the high-impedance state so that it is also possible to operate electrical consumers with very low nominal power.

In a preferred embodiment of the invention the provision is made that the primary winding, which determines the low-impedance state and consequently the on state of the electrical consumer, can be short circuited by a switching means, wherein the short circuit of the primary circuit can be adjusted as a function of a nominal power of the electrical consumer to be switched. This advantageously achieves the fact that by means of the circuit arrangement, electrical consumers can be switched, which have different nominal powers lying in a relatively large dispersion range, without overloading the transformer of the switch actuator.

In another preferable embodiment of the invention, the provision is made that the primary windings can be switched by a switching means which is actuated by the electronic circuit associated with the switch actuator. As a result of this, it is possible to actuate the switching means for switching between the primary windings at any time, independent of the switching state of the switch actuator since the actuation takes place by means of the electronic circuit whose direct voltage supply is carried out independent of the switching state of the switch actuator.

Other advantageous embodiments of the invention ensue from the remaining features disclosed in the dependent claims.

BRIEF DESCRIPTION OF THE DRAWING

The invention will be explained in detail below in exemplary embodiments in conjunction with the accompanying drawings.

FIG. 1 is a schematic representation of the circuit arrangement according to the invention;

FIG. 2 is a block circuit diagram of the circuit arrangement according to the invention in a first embodiment;

FIG. 3 is a detailed representation of the circuit arrangement according to the invention in a second embodiment and FIG. 4 shows a concrete circuit embodiment of the circuit arrangement according to FIG. 3.

DESCRIPTION OF THE EXEMPLARY EMBODIMENTS

FIG. 1 shows a circuit arrangement 10 for connecting an electric consumer 12, for example an incandescent lamp, to an alternating voltage source 14. The alternating voltage source 14 supplies a voltage of 230 volts, for example. In order to switch the electric consumer 12 on and off, a switch actuator 16 is provided, which is connected in series with the electrical consumer 12 by way of connector contacts 18 or 20. The switch actuator 16 is associated with an electronic circuit 22 whose direct voltage supply is carried out by way of the switch actuator 16. According to a concrete exemplary embodiment, the switch actuator 16 and electronic circuit 22 are embodied as standard components which are disposed, for example, in a switch recessing box in a residential wiring and are used to switch the electrical consumer 12 on and off. The electronic circuit 22 includes circuit components that are not shown in detail and can be used, for example, to connect the switch actuator 16 into a line-conducted or line-free bus circuit. Switching data can be predetermined by means of the bus circuit, which data relate to the switching on and off of the electric consumer 12, for example. Since the electric circuit 22 requires an energy source in order to be able to receive the data and trigger the switch function of the switch actuator 16 at any time, this is supplied in the form of a direct voltage supply via the switch actuator 16.

FIG. 2 shows a concrete switch embodiment. The switch actuator 16 includes a transformer 24, which has a first primary winding 26 and a second primary winding 28 as well as a secondary winding 32 that is galvanically decoupled from the primary windings 26, 28 by way of a magnetic circuit 30. The primary windings 26 and 28 are provided with a branch point 34 on the one end and are connected to switch contacts of a switching means 36 on the other. The switching element of the switching means 36 is connected to the connecting clamp 20; the branch point 34 is connected to the connecting clamp 18 (FIG. 1).

The secondary winding 32 is connected to a rectifier 38 which is followed by a voltage regulator 40. The outputs of the voltage regulator 40 are connected to the electronic circuit 22. Electronic circuit 22 is associated with a relay 42, whose coil can be acted on with a switch voltage via the electronic circuit 22 and whose switch element actuates the switching means 36. According to other exemplary embodiments, the switching means can be constituted by a semiconductor component, for example a thyristor, triac, or transistor.

The primary windings 26 and 28 are designed so that the primary winding 26 has a low inductance and the primary winding 28 has a high inductance. In accordance with the inductances of the primary windings 26 and 28, these have a high reactance which constitutes an internal resistance of the switch actuator 16. Depending on the switch position of the switching means 36, the internal resistance of the switch actuator 16 is determined by means of the primary winding 26 or the primary winding 28. Depending on the position of the switching means 36, the electrical consumer 12 (FIG. 1) is connected in series with the primary winding 26 or the primary winding 28. In order to switch on the electrical consumer 12, the primary winding 26 with the low inductance and consequently the low reactance (internal resistance of the switch actuator 16) is connected in series with the electrical consumer 12. A voltage difference over the primary winding 26 lies in a range from 0.2 to 2 volts, for example. In order to switch off the electrical consumer, the primary winding 28 with the high inductance and consequently the high reactance is connected in series with the electrical consumer 20 so that the high-impedance state of the switch actuator 16 is achieved. The voltage difference over the primary winding 28 lies in a range from 50 to 230 volts, for example. This results in a large internal resistance of the switch actuator 16 so that the switching function is possible even with electrical consumers 12 that have a relatively low nominal power. Also in the high-impedance state of the switch actuator 16, the alternating voltage source 14 is connected to the electrical consumer 12 by way of the primary winding 28 so that a current flow is maintained. This assures that even in the high-impedance state of the switch actuator 16, a secondary voltage in the secondary coil 32 can be tapped in a known manner, which is available to supply voltage to the electronic circuit 22 after it is rectified by the rectifier 38 and voltage regulated by the voltage regulator 40. In a known manner, transformer 24 produces a galvanic separation of the primary circuit from the secondary circuit so that in the secondary circuit, a protection low voltage can be produced which does not require special insulation measures—particularly in residential wiring.

In the circuit embodiment shown in FIG. 2, if the circuit arrangement 10 is intended to be used for electrical consumers 12 that have different nominal powers, there is the problem that the nominal current $I_N$ varies sharply in accordance with the nominal power of the electrical consumer 12. According to the simplified $$I = \frac{P}{U}$$

wherein U is the voltage of the alternating voltage source, for example of 230 V, a bandwidth of the nominal current $I_N$ is produced from an electrical consumer 12 with a nominal power of 15 W up to an electrical consumer 12 with a nominal power of 400 W from approx. 60 mA to 1.8 A. In order to avoid designing the primary winding 26 for the maximal possible nominal current $I_N$, according to the switching embodiment shown in FIG. 3, the primary winding 26 must be connected in parallel with a switching means 44. This switching means 44 is used to adjust a primary short circuit of the primary winding 26, wherein the primary short circuit occurs in a load-dependent manner, i.e. as a function of the nominal current $I_N$. This load-dependent primary short circuit is achieved by means of a ratio of one switch-on time $T_1$ to one switch-off time $T_2$ of the switching means 44 for every half-wave of the nominal current $I_N$. According to the closed or open state of the switching means 44, this produces a switching-on or short circuiting of the primary winding 26. In an electrical consumer 12 with a relatively low nominal power P, for example of 15 W, no primary short circuit is produced, i.e. the switch-on time $T_1$ (closed state of the switching means 44) is 0% of the current half-wave of the nominal current $I_N$. According to the actual given nominal power of the electrical consumer 12, an adjustment of the ratio of the switch-on time $T_1$ to the switch-off time $T_2$ now takes place. With an assumed power of 40 W, the ratio of $T_1$ to $T_2$ is 1 for example, i.e. the switch-on time $T_1$ and the switch-off time $T_2$ per half-wave of the nominal current $I_N$ are the same length. This represents a late primary short circuit. The higher the nominal power of the electrical consumer 12, the higher the ratio of the switch-on time $T_1$ to the switch-off time $T_2$ is adjusted. With an assumed nominal power of 400 W, the ratio is for example 18, with reference to the half-wave of the nominal current IN SO that an early primary short circuit is produced. The higher the nominal power of the electrical consumer 12, the longer the switch-on time $T_1$ of the switching means 44 and correspondingly the longer the short circuit time of the primary winding 26 with regard to the half-wave of the nominal current $I_N$.

According to FIG. 4, a concrete switching can take place by virtue of the switching means 44 being constituted by a triac 46, which is connected in parallel with the primary winding 26. In order to damp voltage and current peaks that occur during the switching events of the switching means 44 (triac 46), an oscillating circuit 48 connected in series with the switching means 44 can optionally be provided, which is comprised in a known manner of a parallel connection of an inductor 50 and a capacitor 52.

What is claimed is:

1. A circuit arrangement for connecting an electrical consumer to an alternating voltage source, said circuit arrangement comprising a switch actuator (16) connectable in series with the electrical consumer (12);

an electronic circuit (22) for triggering the switch actuator, said electronic circuit being connected electrically with said switch actuator (16) and supplied with a direct voltage by means of said switch actuator (16), wherein said switch actuator includes a rectifier (38) for supplying said direct voltage to said electronic circuit (22), a transformer (24), said transformer comprising a secondary winding (32) supplying power to said rectifier (38) and two switchable primary windings (26,28), and switching means (42, 36) controlled by said electronic circuit (22) for switching between said primary windings (26,28) to connect one or the other of said primary windings (26,28) with said alternating voltage source, said two switchable primary windings (26,28) comprising a first primary winding (26) having a low inductance and a second primary winding (28) having a high inductance; and another switching means (44) for short-circuiting said first primary winding (26) for a short-circuit duration according to a nominal power consumed by said electrical consumer (12), said another switching means (44) being connected across or in parallel with said first primary winding (26).

2. The circuit arrangement as defined in claim 1, wherein said switching means (42, 36) is a relay (42).

3. The circuit arrangement as defined in claim 1, wherein said switching means (42, 36) is a semiconductor component.

4. The circuit arrangement as defined in claim 1, wherein said another switching means (44) includes means for adjusting a ratio of switch-on time ($T_1$) to switch-off time ($T_2$) of said another switching means according to said nominal power for each half-wave of an alternating voltage supplied by the alternating voltage source.

5. The circuit arrangement as defined in claim 4, wherein said another switching means (44) comprises a triac (46).

6. The circuit arrangement as defined in claim 4, wherein said another switching means (44) comprises a triac (46) and an oscillating circuit (48) for damping voltage and current peaks connected in series with each other.

* * * * *